United States Patent [19]

Zuercher et al.

[11] Patent Number: 5,561,605
[45] Date of Patent: *Oct. 1, 1996

[54] ARC DETECTION USING CURRENT VARIATION

[75] Inventors: Joseph J. Zuercher, Brookfield; Charles J. Tennies, Waukesha, both of Wis.

[73] Assignee: Eaton Corporation, Cleveland, Ohio

[ * ] Notice: The term of this patent shall not extend beyond the expiration date of Pat. No. 5,452,223.

[21] Appl. No.: 438,464

[22] Filed: May 10, 1995

Related U.S. Application Data

[62] Division of Ser. No. 110,090, Aug. 20, 1993, Pat. No. 5,452,223.

[51] Int. Cl.$^6$ .................................................. G01R 19/10
[52] U.S. Cl. ...................... 364/483; 364/487; 324/102; 324/522; 324/536; 340/661; 361/79; 361/86; 361/87
[58] Field of Search ........................ 364/483, 487, 364/480, 481; 324/102, 158 MG, 536, 521, 522; 340/661, 664; 361/78, 79, 86, 87, 2, 5, 6, 7, 42, 63; 323/299, 300, 320, 39

[56] References Cited

U.S. PATENT DOCUMENTS

| H536 | 10/1988 | Strickland | 324/456 |
| Re. 30,678 | 7/1981 | Van Zeeland et al. | 361/44 |

(List continued on next page.)

FOREIGN PATENT DOCUMENTS

| 1210847 | 9/1986 | Canada . |
| 249134 | 8/1987 | Germany . |
| 2177561 | 1/1987 | United Kingdom . |
| 2260043 | 3/1993 | United Kingdom . |
| 2260042 | 3/1993 | United Kingdom . |
| 9004278 | 4/1990 | WIPO . |

OTHER PUBLICATIONS

"Direction Couplers", Antonio N. Paolantonio, RF Design, Sep./Oct. 1979, pp. 40–49.
"Detection of Arcing Faults on Distribution Feeders", Electric Power Research Institute, EPRA EL–2757, Dec. 1982.
"Direction Coupler Design Graphs", Alejandro Duennas J., RF Design, Feb. 1986, pp. 62–64.
"Feasibility of Main Service Gound–Fault Protection on the Electrical Service to Dwelling Units", Consultants Electro-–Protection, Inc., Laval, Quebec, for the Canadian Electrical Association, Oct. 1990.
"Arcing Fault Protection for Low–Voltage Power Distribution System Nature of the Problem", R. H. Kaufmann, J. C. Page, AIEE Winter General Meeting, Jun. 1960; pp. 160–165.

(List continued on next page.)

Primary Examiner—Ellis B. Ramirez
Assistant Examiner—Eric W. Stamber
Attorney, Agent, or Firm—Martin J. Moran

[57] ABSTRACT

In an electric circuit supplying AC line current to a load (30, 31) from an AC source (26) of given frequency providing repetitive cycles, arc detection is provided by sensing cycle to cycle changes in the AC line current. The AC line current is sampled with a harmonic notch filter (72) at a plurality of n phases $\Theta_1$ through $\Theta_n$ during each of a plurality of m cycles of the AC source (26), to provide a plurality of currents $I_{n,m}$, where n is the phase and m is the cycle. The differences $(I_{n,m})-(I_{n,m-x})$, where x is a designated number of cycles, provide a plurality of current difference signals. The absolute values of these current difference signals ID are accumulated in a synchronous summer (94) over the m cycles. An arc indicative signal is generated in response to given conditions and given combinations of conditions (116) of the cumulative absolute current difference signals ID. Cycle to cycle changes in AC line voltage are also sensed with a harmonic notch filter (146), and the arc indicative signal is disarmed in response to a given voltage condition. In further embodiments, subcycle changes are sensed.

48 Claims, 7 Drawing Sheets

U.S. PATENT DOCUMENTS

| | | | |
|---|---|---|---|
| 2,808,566 | 10/1957 | Douma | 324/127 |
| 3,471,784 | 10/1969 | Arndt et al. | 324/126 |
| 3,515,943 | 6/1970 | Van Cortlandt | 317/27 |
| 3,588,611 | 6/1971 | Lambden et al. | 317/31 |
| 3,622,872 | 11/1971 | Boaz | 324/52 |
| 3,746,930 | 7/1973 | Van Best et al. | 317/31 |
| 3,775,675 | 11/1973 | Freeze et al. | 324/51 |
| 3,869,665 | 3/1975 | Kenmochi et al. | 324/72 |
| 3,878,460 | 4/1975 | Nimmersso | 324/52 |
| 3,911,323 | 10/1975 | Wilson et al. | 317/18 R |
| 3,914,667 | 10/1975 | Waldron | 317/36 TD |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,316,187 | 2/1982 | Spencer | 340/664 |
| 4,333,151 | 6/1982 | Matsushima | 364/483 X |
| 4,376,243 | 3/1983 | Renn et al. | 219/514 |
| 4,387,336 | 6/1983 | Joy et al. | 324/51 |
| 4,423,459 | 12/1983 | Stich et al. | 364/483 X |
| 4,466,071 | 8/1984 | Russel, Jr. | 364/492 |
| 4,639,817 | 1/1987 | Cooper et al. | 361/62 |
| 4,644,439 | 2/1987 | Tearning | 361/87 |
| 4,694,402 | 9/1987 | McEachern et al. | 324/102 X |
| 4,697,218 | 9/1987 | Nicolas | 361/87 |
| 4,771,355 | 9/1988 | Emery et al. | 361/33 |
| 4,774,621 | 9/1988 | Andow | 364/483 X |
| 4,791,518 | 12/1988 | Fischer | 361/2 |
| 4,797,805 | 1/1989 | Nimerstö | 364/483 X |
| 4,810,954 | 3/1989 | Fam | 324/142 |
| 4,827,369 | 5/1989 | Saletta et al. | 364/483 X |
| 4,833,414 | 5/1989 | Heller | 364/483 X |
| 4,853,818 | 8/1989 | Emery et al. | 361/33 |
| 4,858,054 | 8/1989 | Franklin | 361/57 |
| 4,922,368 | 5/1990 | Johns | 361/62 |
| 4,931,894 | 6/1990 | Legatti | 361/45 |
| 4,949,214 | 8/1990 | Spencer | 361/95 |
| 5,047,724 | 9/1991 | Boksiner et al. | 324/520 |
| 5,121,282 | 6/1992 | White | 361/42 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/530 |
| 5,224,006 | 6/1993 | MacKenzie et al. | 361/45 |
| 5,229,651 | 7/1993 | Baxter, Jr. et al. | 340/661 X |
| 5,280,404 | 1/1994 | Ragsdale | 361/113 |
| 5,307,230 | 4/1994 | MacKenzie | 361/96 |

OTHER PUBLICATIONS

"A Programmable Circuit Breaker", Richard S. Sanford, Wayne Prentice, ©1982 IEEE; pp. 365–369.

"Distribution High Impedance Fault Detection Utilizing High Frequency Current Components", B. M. Aucoin, B. D. Russell, IEEE Transaction on Power Apparatus and Systems, vol. PAS–101, No. 6, Jun. 1982; pp. 1596–1606.

"High–Impedance Fault Detection Using Third–Harmonic Current", Hughes Aircraft Company, Electric Power Research Institute, EPRI–EL–2430, Jun. 1982.

"Incipient Fault Identification Through Neutral RF Monitoring of Large Rotating Machines", James E. Timperley, IEEE Transactions on Power Apparatus and Systems; vol. PAS–102, No. 3; Mar 1983; pp. 693–698.

"Status of High Impedance Fault Detection", Mike Aucoin, IEEE Transactions on Power Apparatus and System; vol. PAS–104, No. 3; Mar. 1985, pp. 638–644.

"A Microcomputer Based Data Acquisition System for High Impedance Fault Analysis", Robert E. Lee, Raymond H. Osborn, IEEE Transactions Power Apparatus and Systems; vol. PAS–104; No. 10; Oct. 1985; pp. 2748–2753.

"Arcing Fault Protection of Low–Voltage Distribution Systems in Buildings", A. Kusko, S. M. Peeran, ©1987 IEEE, pp. 1385–1389.

"Microcomputer Based Feeder Protection and Monitoring System–Utility Experience", Martin Narendorf, B. Don Russell, Mike Aucoin, IEEE Transactions on Power Delivery; vol. PWRD–2; No. 4; Oct. 1987; pp. 1046–1052.

"Harmonic Behavior during Arcing Faults on Power Distribution Feeders", C. J. Kim, B. Don Russell, Electric Power Systems Research; 14 (1988); pp. 219–225.

"Algorithm Comparison for High Impedance Fault Detection Based on Staged Fault Test", Ching–Lien Huang, Hui–Yung Chu, Ming–Tong Chen, IEEE Transactions on Power Delivery; vol. 3; No. 4; Oct. 1988, pp. 1427–1435.

"Behaviour of Low Frequency Spectra During Arcing Fault and Switching Events", B. Don Russell, Ram P. Chinchali, C. J. Kim, IEEE Transactions on Power Delivery; vol. 3; No. 4, Oct. 1988; pp. 1485–1492.

"An Arcing Fault Detection Technique Using Low Frequency Current Components—Performance Evaluation Using Recorded Field Data", B. Don Russell, Ketan Mahta, Ram P. Chinchali, IEEE Transactions on Power Delivery, vol. 3; No. 4; Oct. 1988; pp. 1493–1500.

"Improved Algorithm for Detecting Arcing Faults Using Random Fault Behavior", Carl Benner, Pat Carswell, B. Don Russell, Electric Power Systems Research, 17 (1989) pp. 49–56.

"A Digital Signal Processing Algorithm for Detecting Arcing Faults on Power Distribution Feeders", B. Don Russell, Ram P. Chinchali, IEEE Transactions on Power Delivery; vol. 4, No. 1; Jan 1989; pp. 132–140.

"Ground Resistance—Revisited", Donald I. Jeerings, John R. Linders, IEEE Transactions on Power Delivery, vol. 4, No. 2; Apr. 1989, pp. 949–956.

"Optimal Arcing Fault Detecting Using Signal Processing Techniques", Shiping Li, B. Don Russell, Electric Power Systems Research; 21 (1991), 121–128.

"Digital Simulation of Fault Arcs in Power Systems", M. Kizilcay, T. Pniok, ETEP vol. 1, No. 1; Jan./Feb. 1991.

"High Impedance Fault Detection Utilizing Incremented Variance of Normalized Even Order Harmonic Power", Wook Hyun Kwon, Gi Won Lee, Young Moon Park, Man Chul Yoon, Myeoung Ho Yoo, IEEE Transactions Power Delivery; vol. 6, No. 2; Apr. 1991; pp. 557–563.

"Fault–Locating Method Using Harmonic Components of the Arc–Voltage Waveform", Masayuki Okazaki, Tsuginori Inaba, Electrical Engineering in Japan; vol. 113, No. 3; 1993; pp. 27–35.

"Hendry Arc Detector", Power Quality; Sep. 1992; Proceedings; pp. 373–374.

"Ships Service Electronic Power: Enhanced Survivability Via Early Detection of Incipient Cable Faults", S. E. Williams and B. Don Russell; Naval Engineers Journal; vol. 205; No. 3; May, 1993; pp. 78–84.

"Detecting Arcing Downed —Wires Using Fault Current Flicker and Half–Cycle Asymmetry", A. F. Sultan, G. W. Swift, D. J. Fedirchuk, IEEE Transactions on Power Delivery; vol. 9, No. 1; Jan. 1994; pp. 461–469.

"Security Testing of High Impedance Fault Detectors", A. F. Sultan, G. W. Swift; pp. 191–197.

"Arcing Ground Fault Detection System", Bulletin 1409, Allen–Bradley Co. catalog; undated, pp. 192–193.

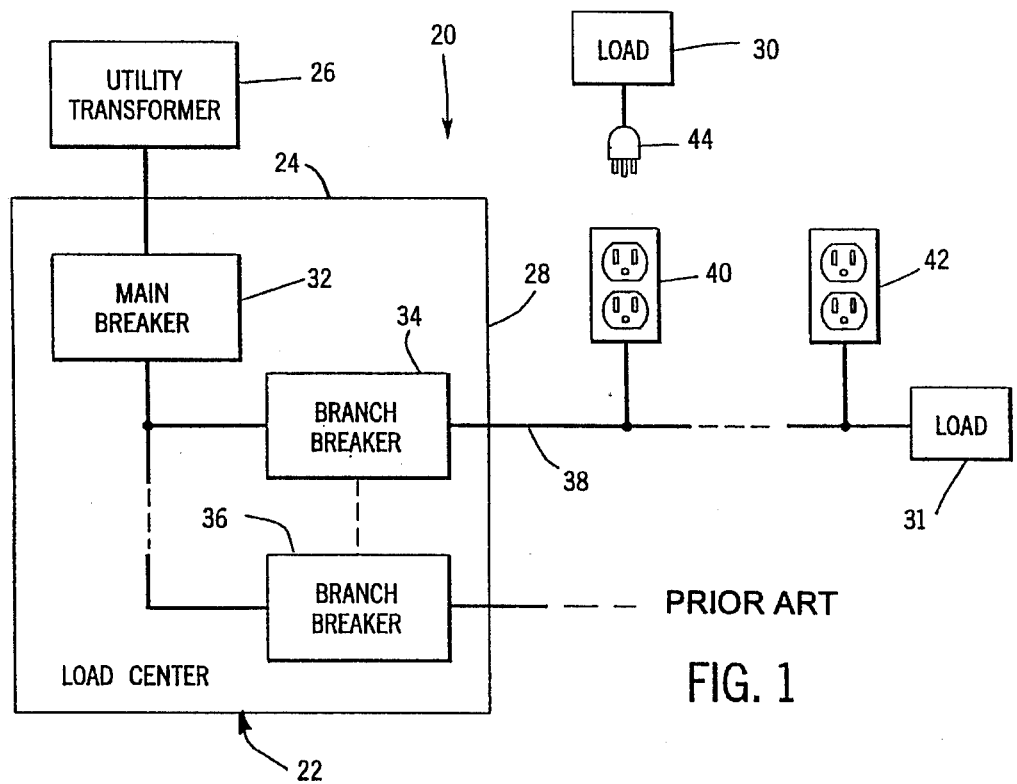
PRIOR ART
FIG. 1
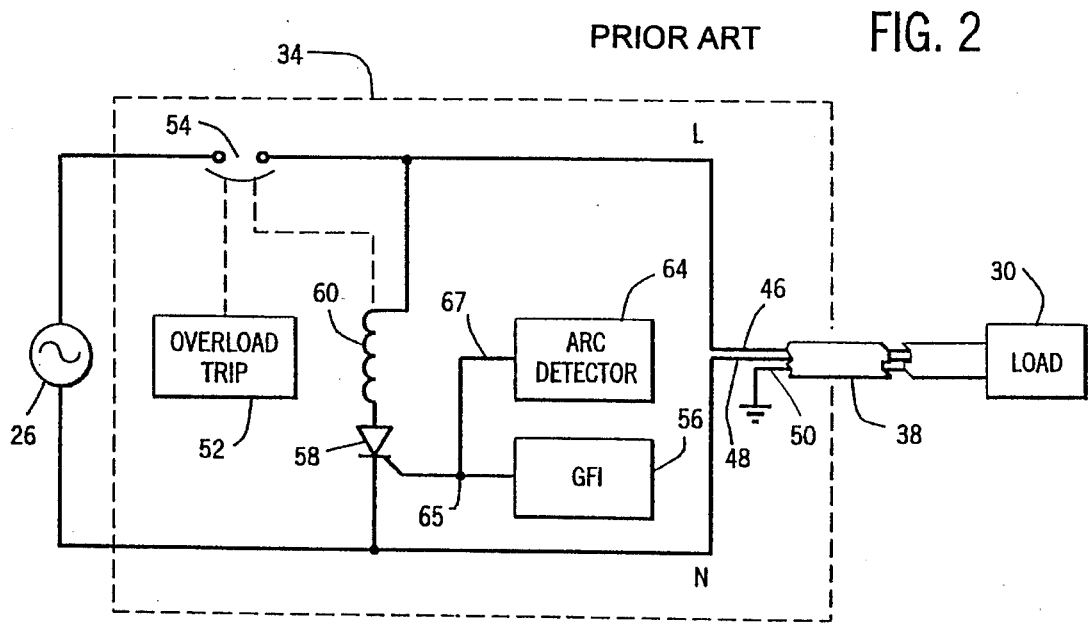
PRIOR ART   FIG. 2

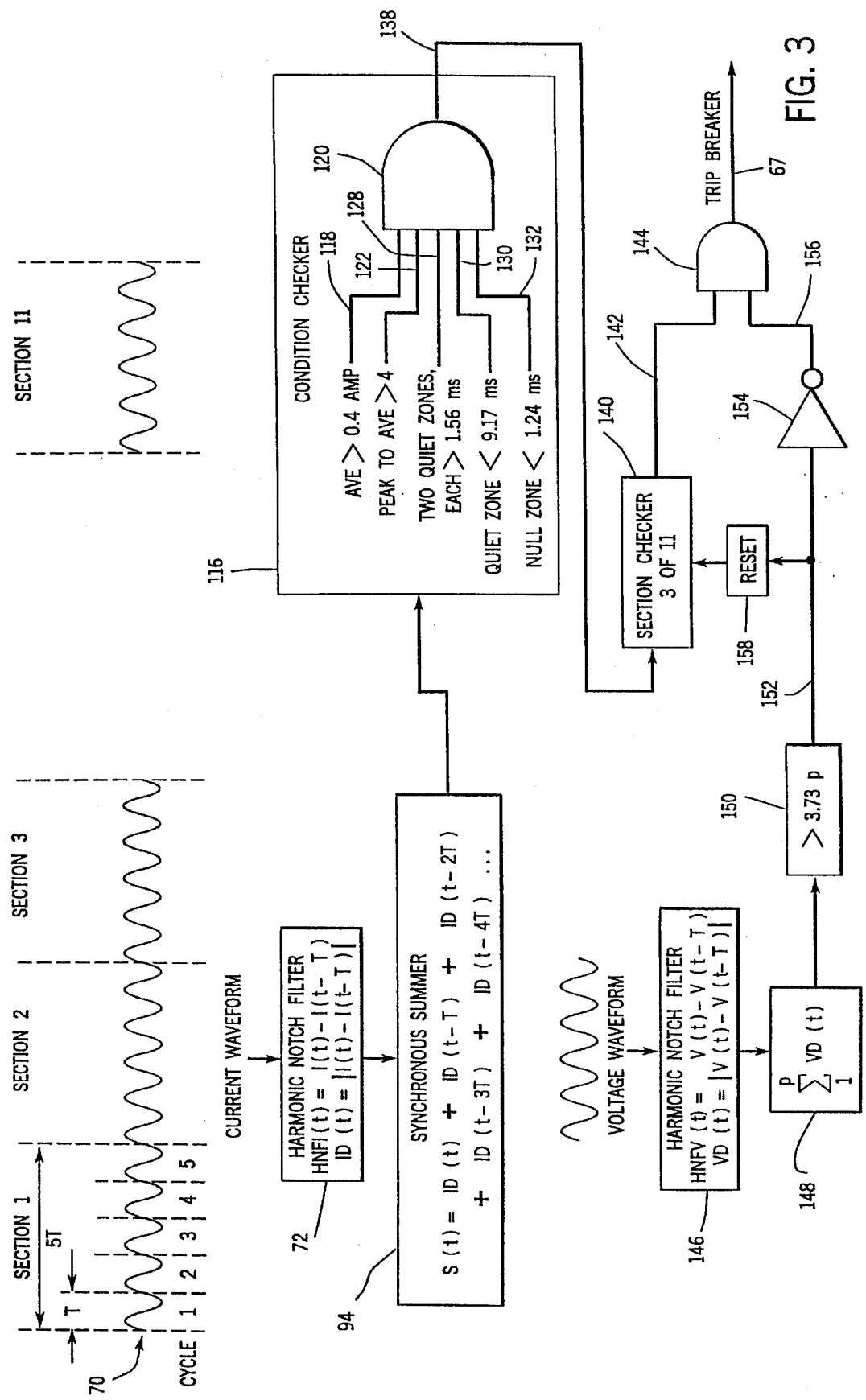

FIG. 8
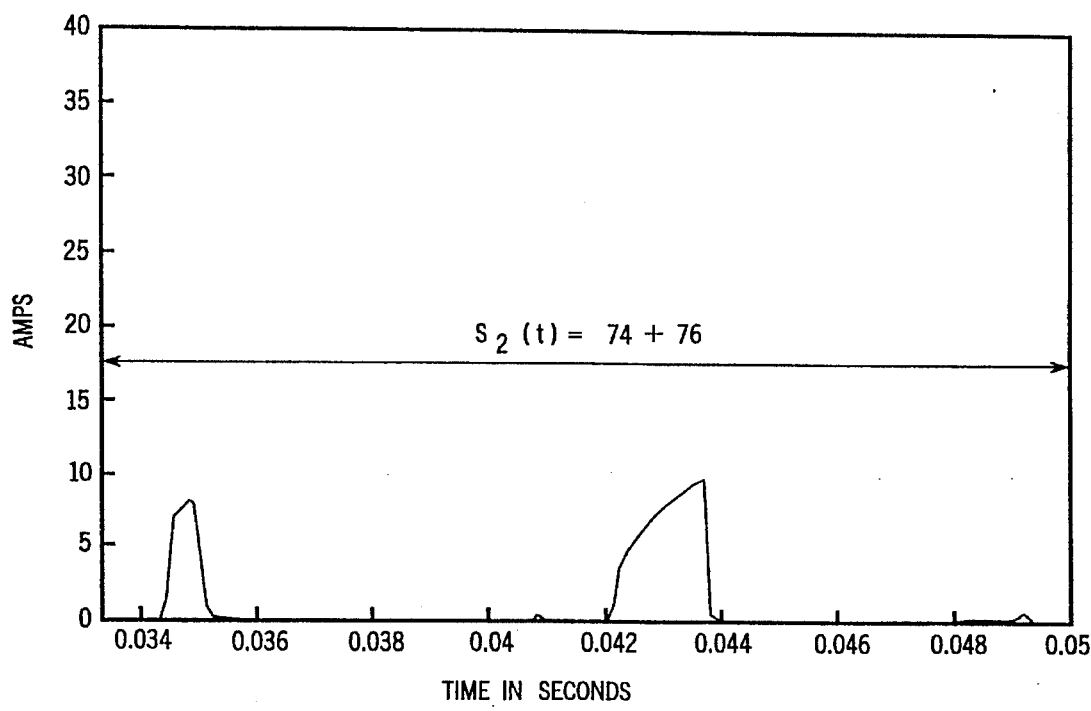
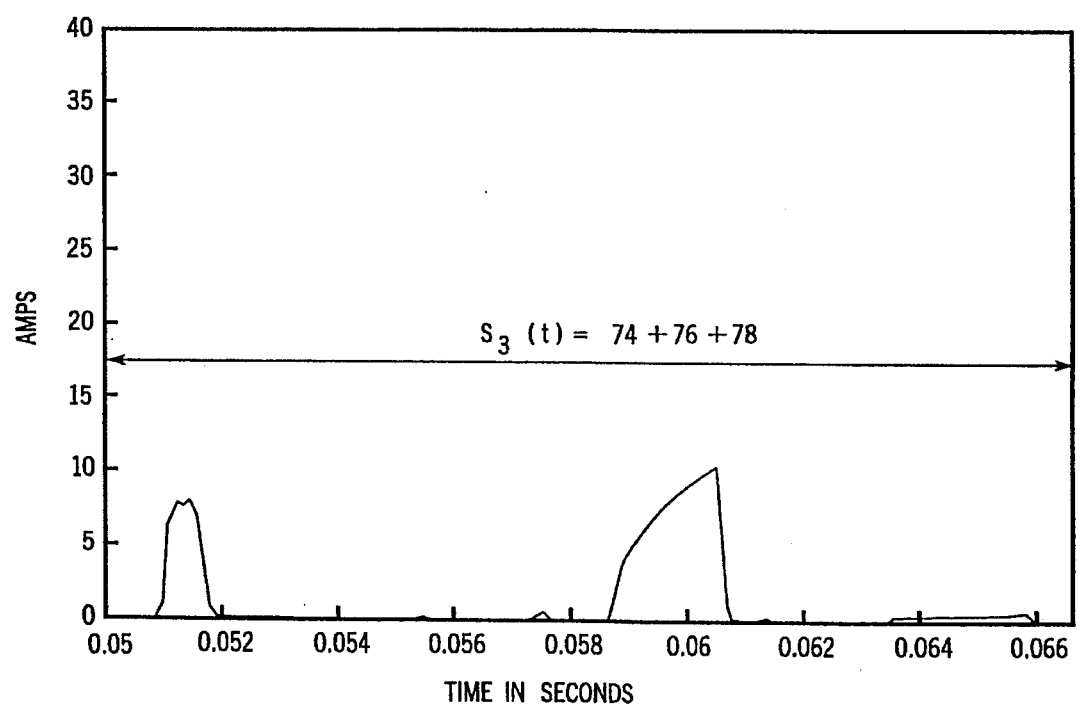
FIG. 9

FIG. 10
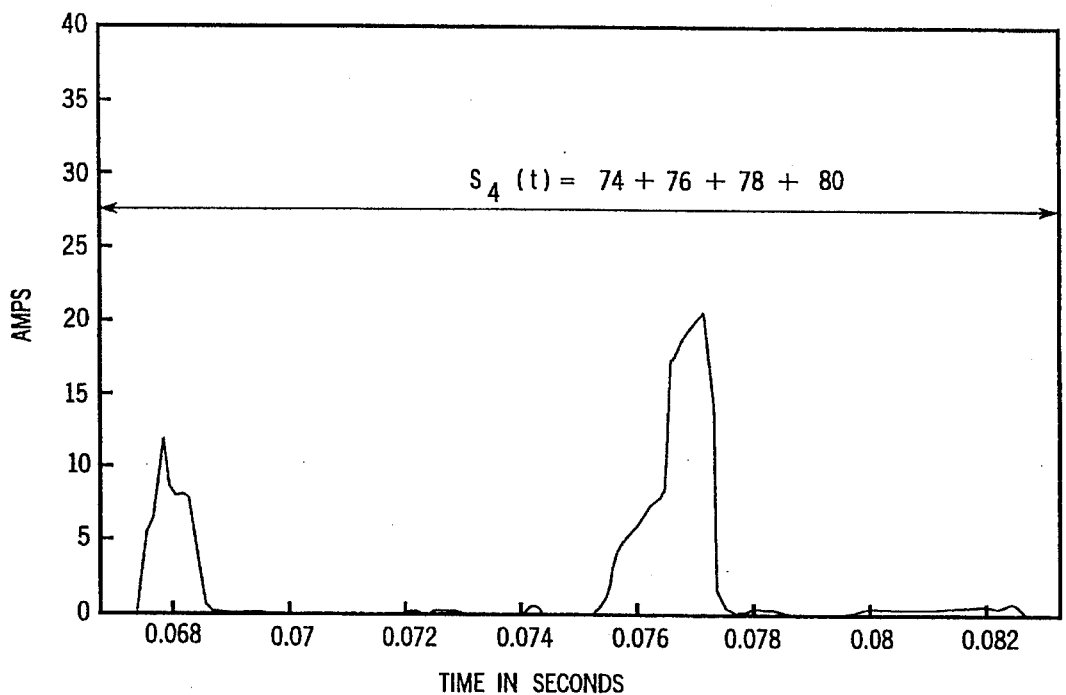
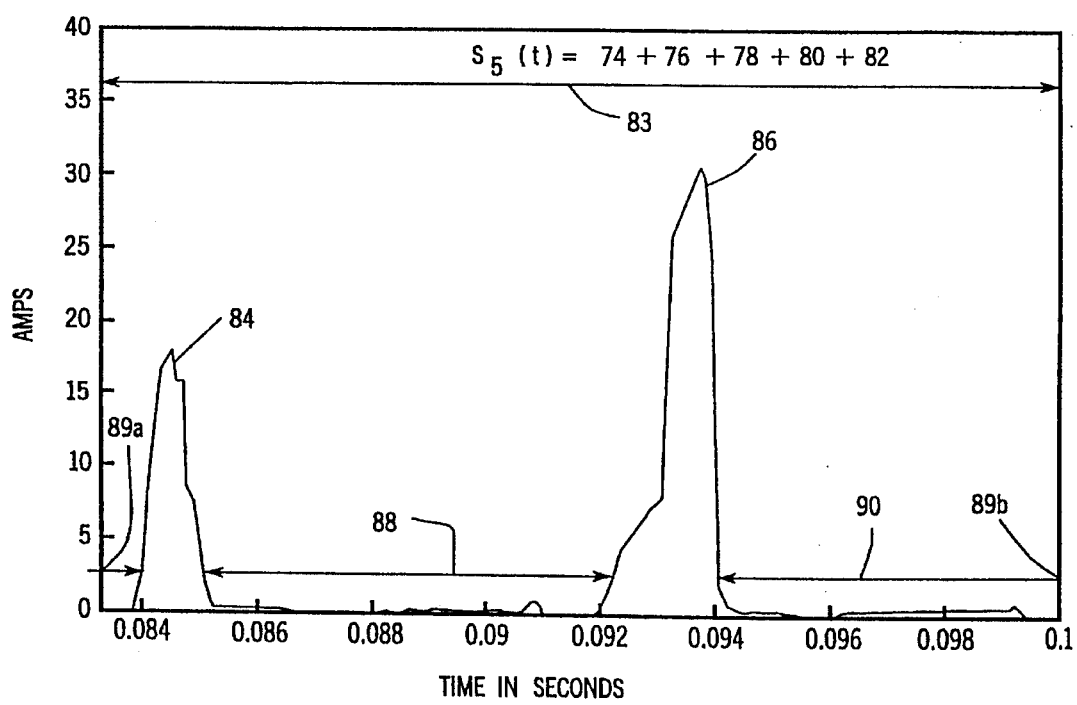
FIG. 11

ARC DETECTION USING CURRENT VARIATION

This is a division, of application Ser. No. 08/110,090, filed Aug. 20, 1993, now U.S. Pat. No. 5,452,223.

BACKGROUND AND SUMMARY

The invention relates to protection techniques for electric circuits, and more particularly to the detection of arcs which are too small to trip a circuit breaker or the like.

The invention arose during development efforts in electric circuit protection techniques, including residential, commercial and industrial applications having overcurrent protection and/or ground fault interrupter (GFI) systems for preventing property damage and/or personal injury. Overcurrent protection systems typically include a load center or panelboard receiving electrical power from the utility company transformer, and routing the electrical power through a main circuit breaker or fuse and then through branch circuit breakers or fuses to designated branch circuits, each supplying current to one or more electrical loads. The circuit breakers or fuses are designed to interrupt the electrical current if it is excessive or outside the design limits of the conductors and loads or demonstrates a current imbalance, to reduce the risk of injury and damage, including fires. Circuit breakers are more commonly preferred because they are reusable simply by resetting same.

A circuit breaker has a thermal/magnetic trip characteristic. The thermal characteristic is operative in response to overload current of extended duration which heats a bimetal member, causing movement of the latter, which in turn releases a latch to trip open a set of contacts. For example, the thermal characteristic would respond to 30 amps being drawn in a 15 amp circuit. The magnetic characteristic is operative in response to a sudden high magnitude current overload condition, and uses the magnetic field generated in a magnetic core to attract an armature, which movement releases the latch to open the contacts. As an example, the magnetic type actuation occurs in response to a short circuit wherein the hot line conductor becomes directly connected with ground or neutral, bypassing the load.

A further type of circuit protection is provided by a ground fault interrupter, which trips the breaker to an open circuit condition in response to an imbalance of currents between the line and neutral conductors of a given circuit. This is particularly desirable in the event that a person is in the path to ground.

The present invention addresses a further type of electric circuit protection and monitoring, namely the detection of arcing in the electric circuit. The arcs to be monitored include not only a discharge of electricity through a gas or across an insulating medium, but also high impedance faults or other intended or unintended circuit paths which do not have sufficient energy or current flow to trip a breaker, but nevertheless can generate damaging heat or other undesirable effects. An arc may occur in series or parallel with the load, and may have numerous causes, for example loose connections, worn or aged wiring or insulation, prior mechanical or electrical stressing such as caused by crimping or twisting, overuse, prior lightning strikes, etc. The current in such arcs may be below the thermal and magnetic trip settings of the breaker or a fuse, and/or may not present an imbalance of currents between the line and neutral conductors, and hence such arcs can go undetected. A particular hazard due to arcing is hot spots along electrical wiring in a residence or the like, which is a fire risk. This wiring can include wall conductors, junction boxes, receptacles, switches, plugs, cords such as extension cords, and the load devices themselves.

The present invention provides effective arc detection. The invention is particularly well suited to discriminating between potentially damaging arcs and either non-arcing events or momentary short duration switching events, which is desirable in order to prevent nuisance tripping. The invention does not trip in response to all arcs, nor all seemingly arc-like events, but rather relies upon statistical probabilities to provide an arc indicative signal in response to an event which has a strong likelihood of being an arc. To attempt to respond to all arcs would involve an unacceptably high occurrence of nuisance tripping, which is undesirable because it may shut down machinery or safety equipment which should remain running, except for those events actually having a high statistical probability of being an arc.

BRIEF DESCRIPTION OF THE DRAWINGS

FIG. 1 is a schematic illustration of an electrical current distribution circuit, and is taken from FIG. 1 of U.S. Pat. No. 5,185,685, incorporated herein by reference.

FIG. 2 is a schematic illustration of a portion of the circuit of FIG. 1, and is similar to FIG. 2 of the noted incorporated '685 patent.

FIG. 3 is a functional block diagram of an arc detector in accordance with the invention.

FIGS. 7–11 are waveform diagrams illustrating cumulative operation of a portion of the circuit of FIG. 3.

DETAILED DESCRIPTION

Figure 4:
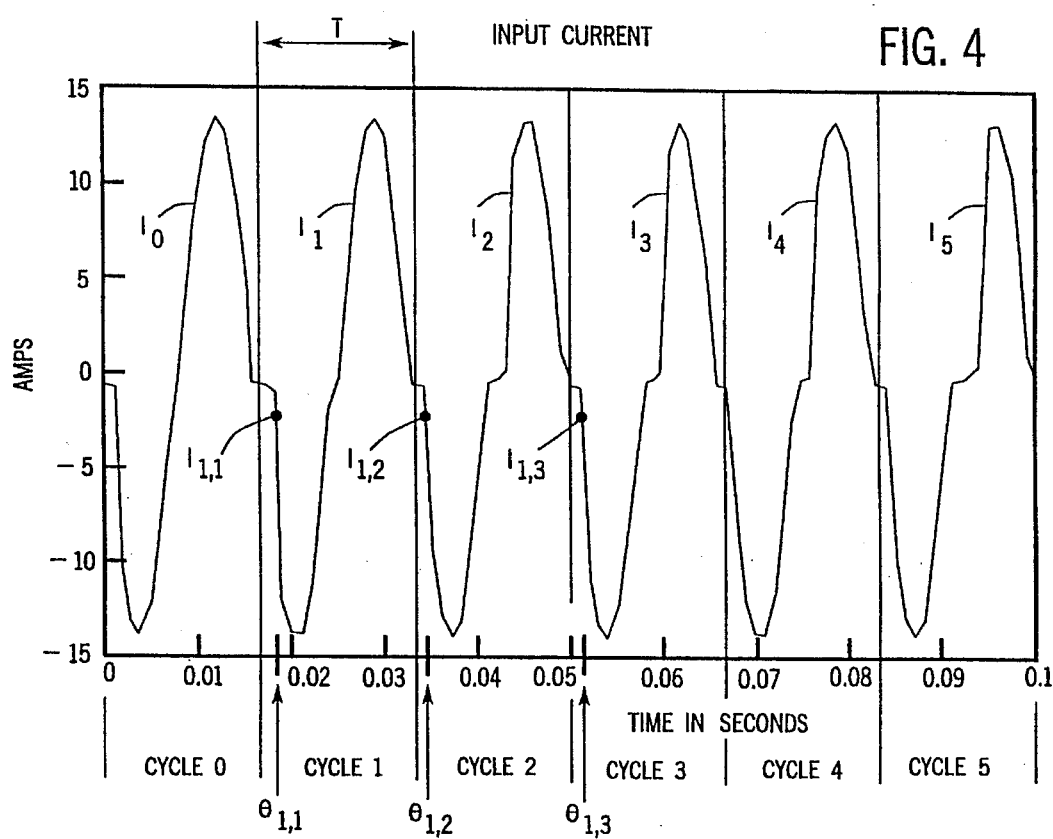
FIG. 4 is a waveform diagram showing AC line current for one particular example.

FIG. 1 shows an electrical current distribution circuit 20 including a load center 22 having a line side 24 for receiving electrical power from a voltage source 26 of predetermined excitation frequency, and a load side 28 distributing the electrical power to loads such as 30 and/or 31. The voltage source can be a power utility company transformer supplying electrical power on first and second line conductors at 240 volts, and a neutral conductor at 120 volts relative to the first and second line conductors, all at, e.g., 60 Hz. The invention is not limited to such example, and can be applied to any AC system operating at any voltage and frequency, including 480 and 660 volts, and 50, 60 and 400 Hz. The load center has a main electro-responsive circuit breaker 32 receiving the electrical power from transformer 26 and distributing the electrical power to branch circuit breakers 34, 36, etc. The branch circuit breakers in turn supply the electrical power on branch circuits such as 38 to electrical outlets 40, 42, etc. into which load 30 is plugged at plug 44, or branch circuit 38 which is wired directly to load 31. Branch circuit 38 includes a line conductor 46, FIG. 2, and a neutral conductor 48 supplying the electrical power to load 30. Branch circuit 38 may also include a ground conductor 50. Circuit breaker 34 includes an overload trip mechanism 52 having a thermal/magnetic characteristic tripping breaker contacts 54 to an open circuit condition in response to a given circuit overload condition, to disconnect load 30 from the voltage source 26, as is known in the prior art. It is also known in the prior art to provide circuit breaker 34 with ground fault interrupter circuitry 56 responding to a line or neutral to ground fault to gate SCR 58 into conduction to in turn energize coil 60 which opens breaker contacts 54. An example of a GFI circuit is shown in U.S. Pat. Re. No. 30,678, incorporated herein by reference.

The present invention provides an arc detector 64 and arc detection method for the electric circuit supplying AC line current to load 30 from AC source 26 of given frequency providing repetitive cycles, e.g. 60 Hz providing repetitive cycles each having a period of 16.67 milliseconds. Arc detector 64 senses cycle to cycle changes in AC line current and generates difference signals representing such changes, to be described, and responds to given conditions of the difference signals to generate an arc indicative trip signal on line 67 providing a gating signal supplied to the gate of SCR 58 to gate the SCR into conduction and energize coil 60 to open breaker contacts 54. The outputs of circuits 56 and 64 are connected at a common node 65 to the gate of SCR 58. If the circuit breaker does not have GFI circuit 56, the SCR 58 and coil 60 are added.

FIG. 3 shows arc detector 64. AC line current is shown as current waveform 70, FIGS. 3 and 4, which is the AC current supplied on line 46, FIG. 2, from AC source 26 to load 30. The current is preferably sensed with a current transformer, for example as shown at 68 in the incorporated '685 patent, though the current may be sensed with other current sensors. The sensed AC line current is sampled with a harmonic notch filter 72 at a plurality of sampling points or phases n during a plurality of cycles m, with the relative phase of the respective sampling point being the same cycle to cycle.

For example, referring to FIG. 4, the AC line current is sampled at a phase $\Theta_{1,1}$ during a first cycle of the AC source to provide a first sampled current $I_{1,1}$. The first subscript is the phase or sampling point and the second subscript is the cycle; hence, $I_{1,1}$ is the current at the first phase or sampling point in the first cycle. The AC line current is sampled at a first phase or sampling point $\Theta_{1,2}$ during a second cycle of the AC source to provide a sampled current $I_{1,2}$, which is the current at the first phase or sampling point in the second cycle. The AC line current is sampled at the same relative phase during each of the first and second cycles, i.e. $\Theta_{1,1}$ equals $\Theta_{1,2}$. Stated another way, $\Theta_{1,1}$ and $\Theta_{1,2}$ are spaced or separated by one cycle, or 360°, of the AC source, or an integral multiple thereof. In the case of a 60 Hz AC source, $\Theta_{1,1}$ and $\Theta_{1,2}$ are spaced by 1/60 of a second, i.e. 16.67 milliseconds, or an integral multiple thereof. The noted difference signals are provided by subtracting $I_{1,1}$ from $I_{1,2}$.

The AC line current is sampled with the harmonic notch filter at a plurality of phases $\Theta_{1,1}$ through $\Theta_{n,1}$ during a first cycle of the AC source to provide a plurality of sampled currents $I_{1,1}$ through $I_{n,1}$ for the first cycle. The AC line current is sampled with the harmonic notch filter at a plurality of phases $\Theta_{1,2}$ through $\Theta_{n,2}$ during a second cycle of the AC source to provide a plurality of sampled currents $I_{1,2}$ through $I_{n,2}$ for the second cycle. $\Theta_{1,1}$ through $\Theta_{n,1}$ equals $\Theta_{1,2}$ through $\Theta_{n,2}$, respectively, i.e. the first sampling point in the first cycle occurs at the same relative phase as the first sampling point in the second cycle, the second sampling point in the first cycle occurs at the same relative phase as the second sampling point in the second cycle, and so on. The sampled currents $I_{1,1}$ through $I_{n,1}$ are subtracted point for point from the sampled currents $I_{1,2}$ through $I_{n,2}$, respectively, by the harmonic notch filter, to provide the noted difference signals. It is preferred that the first, second and so on cycles be consecutive.

Harmonic notch filter 72 performs the noted point for point subtraction of $I_{1,1}$ through $I_{n,1}$ from $I_{1,2}$ through $I_{n,2}$, respectively, to provide harmonic notch filter current difference signals HNFI, the absolute value of which provides current difference signals ID. For example, sampled current $I_{1,1}$, which was the current sampled at the first sampling point in the first cycle, i.e. at $\Theta_{1,1}$, is subtracted from sampled current $I_{1,2}$, which is the current sampled at the first sampling point in the second cycle, i.e. at $\Theta_{1,2}$, to provide an HNFI difference signal, the absolute value of which provides a current difference signal $ID_{1,2-1}$, i.e. the absolute value of the difference in sampled current between the first and second cycles at the first phase or sampling point. Likewise, the AC line current is sampled at phase $\Theta_{1,3}$ during a third cycle of the AC source to provide a sampled current $I_{1,3}$, where $\Theta_{1,2}$ equals $\Theta_{1,3}$. $I_{1,2}$, which is the sampled current at the first sampling point in the second cycle, is subtracted from $I_{1,3}$, which is the sampled current at the first sampling point in the third cycle, to provide an HNFI difference signal, the absolute value of which provides a current difference signal $ID_{1,3-2}$, which is the absolute value of the difference between the sampled current at the first sampling phase point in the third cycle and the sampled current at the first sampling phase point in the second cycle.

Figure 5:
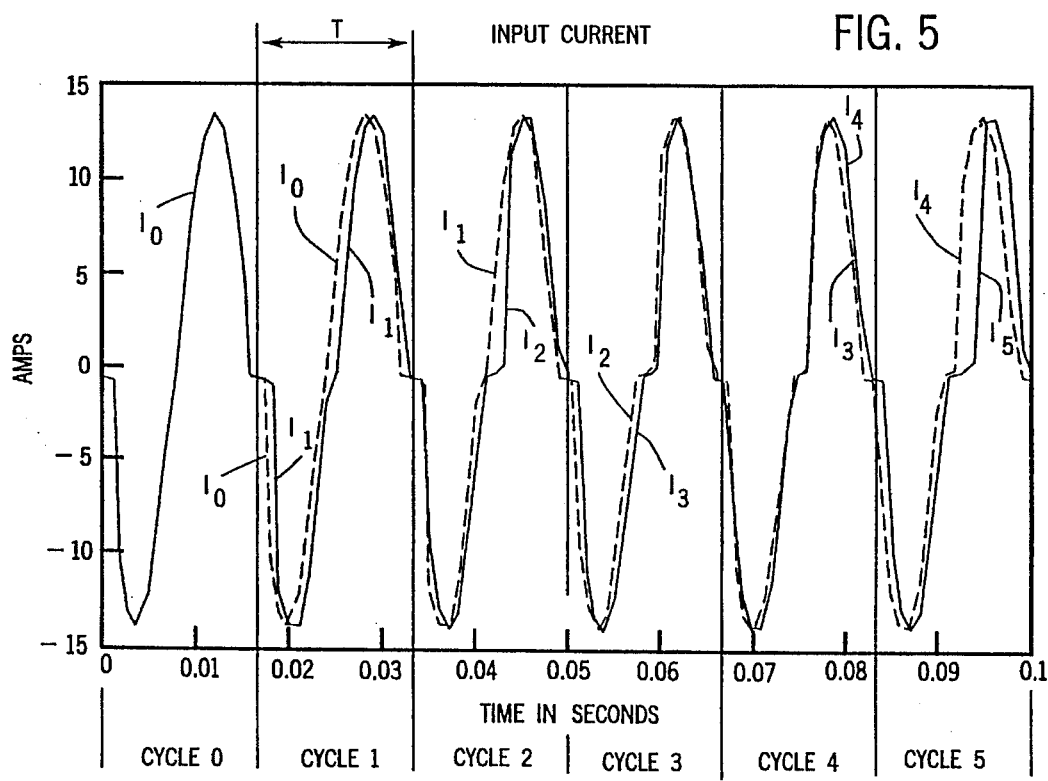
FIG. 5 is a waveform diagram illustrating operation of a portion of the circuit of FIG. 3.

FIG. 5 shows the current for the present cycle in solid line, and the current for the immediately preceding cycle in dashed line. Thus, in the first cycle, the first cycle current $I_1$ is shown in solid line, and the current from the previous or initial cycle is shown at $I_0$ in dashed line. Likewise, in the second cycle, the second cycle current $I_2$ is shown in solid line, and the first cycle current $I_1$ is shown in dashed line, and so on for cycles 3 through 5.

Figure 6:
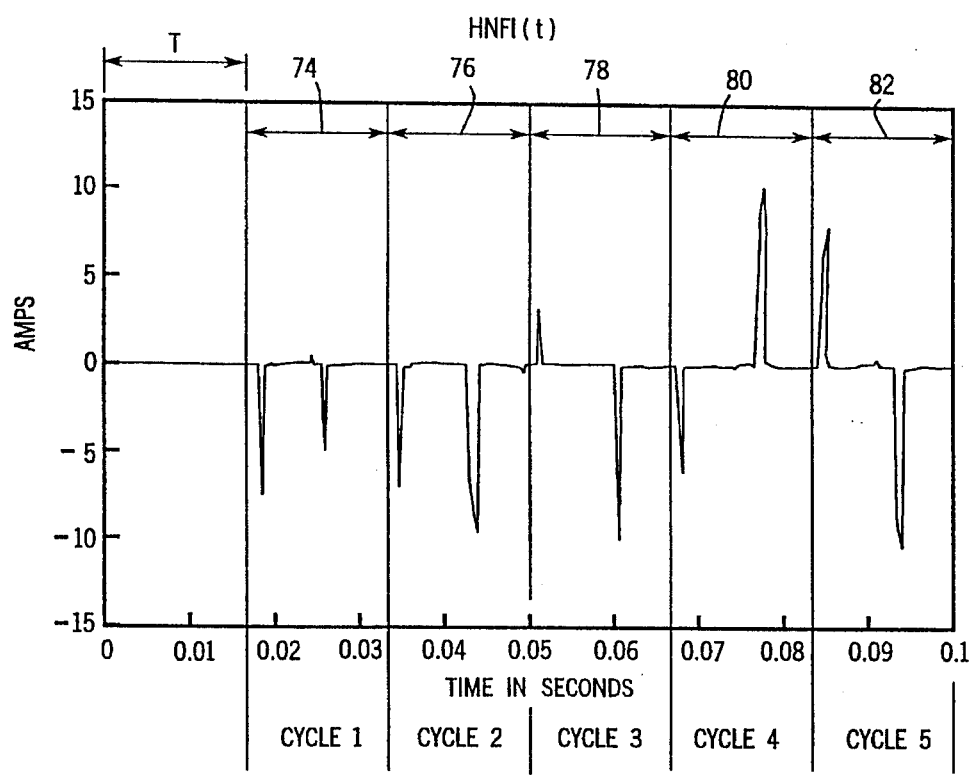
FIG. 6 is a waveform diagram illustrating operation of a portion of the circuit of FIG. 3.

In the particular implementation shown in FIG. 5, the point for point subtraction of $I_0$ from $I_1$ during the first cycle yields the HNFI difference signals shown in span 74 in FIG. 6. In the second cycle in FIG. 5, the point for point subtraction of the previous cycle current $I_1$ from the present cycle current $I_2$ yields the HNFI difference signals shown in span 76 in FIG. 6. In the third cycle in FIG. 5, the point for point subtraction of $I_2$ from $I_3$ yields the HNFI difference signals shown in span 78 in FIG. 6. In the fourth cycle in FIG. 5, the point for point subtraction of $I_3$ from $I_4$ yields the HNFI difference signals shown in span 80 in FIG. 6. In the fifth cycle in FIG. 5, the point for point subtraction of $I_4$ from $I_5$ yields the HNFI difference signals shown in span 82 in FIG. 6.

Harmonic notch filter 94 performs point for point subtraction of AC line currents to provide harmonic notch filter current difference signals HNFI, the absolute value of which provides current different signals ID at time t according to:

$$ID(t)=|HNFI(t)|=|I(t)-I(t-T)| \qquad \text{Eq. 1}$$

where I(t) is the sampled current at time t, and I(t–T) is the sampled current one cycle earlier, i.e. at a time T seconds ago, where T is the period of the AC cycle, i.e. 16.67 milliseconds. Equation 1 defines the harmonic notch filter in the time domain.

The absolute current difference signals ID are synchronously summed at synchronous summer 94, FIG. 3, to provide a sum S(t) according to:

$$S(t)=ID(t)+ID(t-T)+ID(t-2T)+ID(t-3T)+ID(t-4T)\ldots \quad \text{Eq. 2}$$

Figure 7:
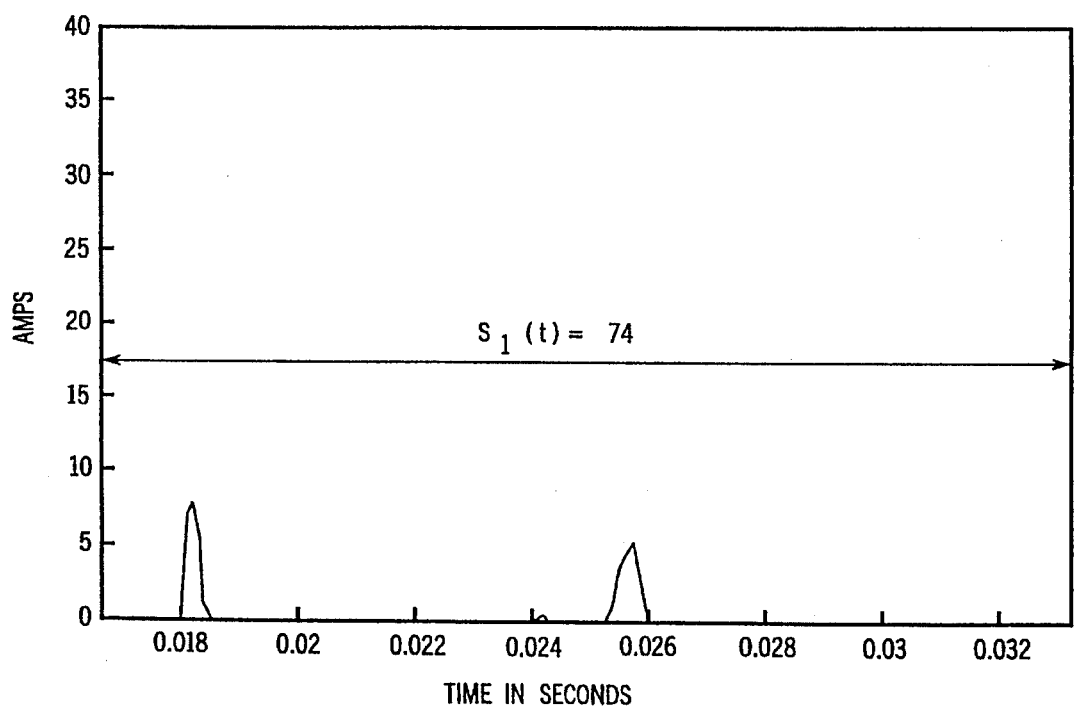

Referring to FIG. 6, the absolute of the difference signals over span 74 are added point for point with the absolute value of the difference signals over span 76 which are added point for point with the absolute value of the difference signals over span 78 which are added point for point with the absolute value of the difference signals over span 80 which are added point for point with the absolute value of the difference signals over span 82. In the example shown, five cycles of cumulative absolute value current difference signals ID are summed, yielding $S_5(t)$, i.e. the summation of the five ID signals. The accumulation of the ID signals is shown sequentially in FIGS. 7–11. FIG. 7 shows the ID signals over span 74 after one cycle, yielding $S_1(t)$. FIG. 8 shows the accumulated ID signals over spans 74+76 after two cycles, yielding $S_2(t)$. FIG. 9 shows the accumulated ID signals over spans 74+76+78 after three cycles, yielding $S_3(t)$. FIG. 10 shows the accumulated ID signals over spans 74+76+78+80 after four cycles, yielding $S_4(t)$. FIG. 11 shows the accumulated ID signals over spans 74+76+78+80+82 after five cycles, yielding $S_5(t)$. The absolute value current difference signals ID are synchronously summed for each phase for five consecutive cycles, to provide the cumulative current difference signals shown in FIG. 11 at 83. If given conditions of cumulative current difference signals are met, related to features 84, 86, 88, 90, to be described, then an arc indicative trip signal is generated on line 67, to be described.

In general, AC line current is sampled at a plurality of phases $\Theta_1$ through $\Theta_n$ during each of a plurality of m cycles. Harmonic notch filter 72 provides n cycle to cycle current difference signals ID, one for each of the phases $\Theta_1$ through $\Theta_n$. Synchronous summer 94 sums m of the current difference signals at phase $\Theta_1$ for cycles 1 through m to provide a first cumulative current difference signal. The summing is continued through the $n^{th}$ phase including summing m of the current difference signals at phase $\Theta_n$ for cycles 1 through m to provide an $n^{th}$ cumulative current difference signal. In the present embodiment, n equals 1,341, i.e. during each cycle, there are 1,341 sampling points or phases. Also in the present embodiment, m equals 5, i.e. synchronous summer 94 sums the current difference signals ID over 5 cycles, to yield $S_5(t)$, as defined in Equation 2, and shown in FIG. 11. The cycle to cycle current difference signals are preferably calculated by taking the difference between consecutive cycles, though they need not be. The first through $n^{th}$ cumulative current difference signals provide the trace shown over span 83 in FIG. 11, m=5. Condition checker 116 of FIG. 3 responds to given conditions, such as 84, 86, 88, 90, FIG. 11, of the cumulative current difference signals to generate the arc indicative trip signal, to be described.

Harmonic notch filter 72 samples AC line current at the noted plurality of n phases $\Theta_1$ through $\Theta_n$ during each of the noted plurality of m cycles of the AC source, where $\Theta_{1,1}$ equals $\Theta_{1,2}$ equals $\ldots \Theta_{1,m}$, and where $\Theta_{2,1}$ equals $\ldots \Theta_{2,2}$ equals $\ldots \Theta_{2,m}, \ldots$, and where $\Theta_{n,1}$ equals $\Theta_{n,2}$ equals $\ldots \Theta_{n,m}$ for each of the m cycles, to provide a plurality of currents $I_{n,m}$, where n is the phase and m is the cycle. The harmonic notch filter performs equation 1 to determine the difference $(I_{n,m})-(I_{n,m-x})$, where x is a designated number of cycles or periods, to provide a plurality of current difference signals ID. In the preferred embodiment, x equals 1, to provide consecutive cycle current difference signals, though cycle to cycle current variation can be determined for cycles which are not consecutive. Synchronous summer 94 accumulates the current difference signals ID over a given number of cycles, preferably 5, i.e. m equals 5, though other values of m may be used. Synchronous summer 94 performs equation 2, adding $ID_{1,1-(1-x)}+ID_{1,2-(2-x)}+\ldots +ID_{1,m-(m-x)}$ to provide a first cumulative current difference signal $ID_1$ at phase $\Theta_1$, and adding $ID_{2,1-(1-x)}+ID_{2,2-(2-x)}+\ldots +ID_{2,m-(m-x)}$ to provide a second cumulative current difference signal $ID_2$ at phase $\Theta_2$, and continuing the adding through the $n^{th}$ phase including adding $ID_{n,1-(1-x)}+ID_{n,2-(2-x)}+\ldots +ID_{n,m-(m-x)}$ to provide an $n^{th}$ cumulative current difference signal $ID_n$ at phase $\Theta_n$. As noted above in the preferred embodiment, n equals 1,341, m equals 5, and x equals 1.

As noted above, condition checker 116 responds to given conditions of the accumulated current difference signals ID from synchronous summer 94, S(t), to generate an arc indicative trip signal. In general, such sum is $S_m(t)$, and in the preferred embodiment m=5. Also in the preferred embodiment, $S_5(t)$ is evaluated once every five cycles. In an alternate embodiment, $S_5(t)$, or some other $S_m(t)$, may be evaluated every cycle on a sliding window basis.

A first of the noted conditions for S(t), as checked by condition checker 116, FIG. 3, is that the average of the cumulative current difference signals $ID_1$ through $ID_n$ exceeds a given threshold current, which in the preferred embodiment is 0.4 amp for m=5, i.e. for $S_5(t)$. The arc indicative trip signal is generated only if the average exceeds the given threshold current. If the average of accumulated $ID_1$ through $ID_n$, i.e. $S_5(t)$, exceeds 0.4 amp, then a high input is provided on line 118 to AND gate 120. Referring to FIG. 11, for m=5, if the average value of the current trace across span 83 exceeds 0.4 amp, then a high input is provided on line 118 to AND gate 120.

A second of the noted conditions for S(t), as checked by condition checker 116, FIG. 3, is that the peak to average ratio of the cumulative current difference signals $ID_1$ through $ID_n$ exceeds a given threshold ratio, where the peak is the maximum value of S(t), and the average is the average value of S(t). The arc indicative trip signal is generated only if the peak to average ratio exceeds the noted given threshold ratio. In the preferred embodiment, for m=5, the given threshold ratio is 4. If the peak to average ratio of the cumulative current difference signals $ID_1$ through $ID_n$ exceeds 4, then a high input is provided on line 122 to AND gate 120. Referring to FIG. 11, for $S_5(t)$, the peak is shown at 86.

A third of the noted conditions for S(t), as checked by condition checker 116, FIG. 3, is that there be at least two quiet zones per cycle, each quiet zone being of a minimum time length, where a quiet zone is a portion of a cycle wherein none of the respective cumulative current difference signals ID therein rise above a given current activity threshold. For example, in FIG. 11, there are two quiet zones 88 and 90. During these quiet zones, S(t) stays below a given current activity threshold. The arc indicative trip signal is generated only if there are at least two quiet zones per cycle. The relative phase of point 89a is in the AC waveform is the same as the relative phase of point 89b, such that zone 90 wraps upon itself. In the preferred embodiment, the minimum time length is the same for each of the quiet zones, and is 1.56 milliseconds. The given current activity threshold is 1.5 times the average of the cumulative current difference signals $ID_1$ through $ID_n$, i.e. 1.5 times the average value of S(t). For example in FIG. 11, the current activity at each of portions 88 and 90 is less than 1.5 times the average current value across span 83, and hence the noted third condition is satisfied, and a high input is provided on line 128 to AND gate 120. In the preferred embodiment, any non-quiet zone having a duration less than 0.311 milliseconds is ignored, to avoid high frequency anomalies. In other words, it is required that a quiet zone last longer than 0.311 milliseconds to be considered valid. If the current activity S(t) signal rises above the noted 1.5 threshold, such as at 84 or 86, but has a duration less than 0.311 milliseconds, then it is considered part of, and absorbed by, the quiet zone.

A fourth of the noted conditions for S(t), as checked by condition checker 116, FIG. 3, is that there be no quiet zone longer than a given quiet time upper limit. The arc indicative trip signal is disabled if any quiet zone such as 88 or 90 lasts longer than the given quiet time upper limit. In the preferred embodiment, the given quiet time upper limit is 9.17 milliseconds. If any quiet zone lasts longer than 9.17 milliseconds, then a low input is provided on line 130 to AND gate 120.

A fifth of the noted conditions for S(t), as checked by condition checker 116, FIG. 3, is that the output of synchronous summer 94 be zero for no longer than a given null time upper limit. The arc indicative trip signal is disabled if any zero output of the synchronous summer lasts longer than the given null time upper limit. In the preferred embodiment, the given null time upper limit is 1.24 milliseconds. If the output of synchronous summer 94 is zero for longer than 1.24 milliseconds, then a low input is provided on line 132 to AND gate 120.

If each of the noted five conditions is satisfied, then each of the inputs 118, 122, 128, 130, 132 to AND gate 120 is high, and a high output signal is provided on line 138, which in turn enables generation of the arc indicative trip signal. The first condition is that the average of S(t) over span 83, FIG. 11, exceeds a given threshold current, to provide a high state on line 118. The second condition is that the peak to average ratio of S(t) exceeds a given threshold ratio, to provide a high state on line 122. The third condition is there be at least two quiet zones per cycle, each of a minimum time length, to provide a high state on line 128. The fourth condition is that there be no quiet zone longer than a given quiet time upper limit, to provide a high state on line 130. If a quiet zone lasts longer than the given quiet time upper limit, then a low state is provided on line 130, which in turn disables AND gate 120, to in turn disable the arc indicative trip signal. The fifth condition is that the output of synchronous summer 94 providing S(t) be zero for no longer than a given null time upper limit, to provide a high state on line 136. If the synchronous summer output S(t) is zero for longer than the given null time upper limit, then a low state is provided on line 132, which in turn disables AND gate 120, to in turn disable the arc indicative trip signal.

The purpose of the noted first condition requiring the average of the cumulative current difference signals, S(t), to exceed a given threshold current such as 0.4 amp is to ensure that there is some minimum activity above noise level. This condition also reduces nuisance tripping wherein a non-arc transient may cause a thin spike in FIG. 11, much thinner than spikes 84 or 86. In the case of a thin spike in FIG. 11, the average across the entire cycle in FIG. 11 including the thin spike may not rise above 0.4 amp. Thus, if a peak or spike in FIG. 11 does not have sufficient width or thickness, the average across the cycle does not rise above the given threshold current, and hence the test is failed, and thus a low state is provided on line 118, FIG. 3. In this manner, thin-spike transients or other operations, such as phase controlled loads operating at a constant duty cycle, are ignored, to reduce nuisance tripping.

The purpose of the noted second condition requiring the peak to average ratio of the cumulative current difference signals, S(t), to exceed a given threshold ratio is to ensure that the spikes such as 84 and 86 in FIG. 11 are not too wide. A spike in FIG. 11 which is too wide, i.e. lasts too long, is typically not caused by an arcing event, but rather is indicative of asynchronous activity such as a start-up transient. The wider the spike in FIG. 11, the greater is the average across the cycle of the cumulative current difference signals, and hence the peak to average ratio does not exceed the noted given threshold, e.g. 4, thus failing such test and providing a low state on line 122, FIG. 3.

The combination of the noted first and second conditions provide arc discrimination by ensuring that an arc indicative peak in FIG. 11 has some minimum width, and height, but is not too wide. It is this intermediate width and activity which distinguishes an arcing event from other events.

The purpose of the noted third condition requiring at least two quiet zones per cycle, such as shown at 88 and 90 in FIG. 11, is to ensure that there are two spikes or pulses such as 84 and 86 per cycle. A characteristic of an arc is that it typically fires or occurs on both the positive and negative half cycles of the sinusoidal AC source 26. FIG. 11 shows the absolute value of the cumulative current difference signals. If there were only one spike in FIG. 11, then the causal event occurred during only one of the half cycles of AC source 26 and is typically not an arcing event. Without this third condition or test, many half-wave loads could cause nuisance tripping.

The noted third condition enables the arc detector to ignore events causing a spike in only one of the half cycles of the AC source, and reduces nuisance tripping. The unpredictableness of an arc may occasionally result in non-firing thereof during a half cycle of perhaps one of the five accumulated cycles in FIGS. 7–11. Even if an arc causes only a single spike in one or two of the five cycles, the remaining cycles can still buildup and accumulate a sufficient current difference signal in FIG. 11 to provide the second spike. It has been observed that arcs almost always occur during both half cycles of the AC source, and this characteristic is usefully employed by the noted third condition as another test to discriminate against non-arcing events.

It has further been observed that many arcs have four peaks per cycle in FIG. 11. This is caused by a strike and recovery and a re-strike and recovery during each half cycle. The time length of the requisite quiet zones are selected to accommodate such re-strike, i.e. to allow four peaks across the cycle in FIG. 11.

The purpose of the noted fourth condition requiring that no quiet zone last longer than a given quiet time upper limit is to ensure that the two peaks 84 and 86 in FIG. 11 are roughly 180° out of phase and have the noted intermediate thickness or width. The given quiet time upper limit is chosen to be 55% of the cycle, i.e. 9.17 milliseconds is 55% of 16.67 milliseconds. In accordance with this disable condition or test, if any quiet zone such as 88 or 90, FIG. 11, is longer than 55% of the cycle, then the causal event is ignored and deemed not an arc. Without this fourth condition or test, a number of nuisance trips are experienced on various loads, such as most variable speed drills which operate half-wave at low RPM.

The noted fifth condition requiring that no zero output of the synchronous summer last longer than a given null time upper limit is included to enable a cost reduction for commercialability. If cost were no factor, a wide dynamic range would be desirable, which in turn requires a more expensive current sensor, more digital memory, and a larger available supply voltage range. If the extra cost is objectionable, then lower cost elements can be used, which may saturate at less than the peak of the incoming AC wave, which in turn reduces dynamic range. The input AC wave is thus clipped at such saturation point defined by the system resolution, which in turn artificially creates two null zones, at which the output of the synchronous summer is absolutely zero. The fifth condition limits such null zone to a given null time upper limit, e.g. 1.24 milliseconds, such that any longer lasting saturation is deemed a non-arcing event. From a technical standpoint, it is preferred that the noted fifth condition or test not be included. From a commercial cost-saving standpoint, it is preferred that the noted fifth condition or test be included.

An arc occurs randomly and unpredictably. It is this randomness, wherein the arc and its relative time of occurrence is never quite the same cycle to cycle, that enables detection by arc detector 64. If there were no cycle to cycle changes of the current, there would be no current difference signal ID out of the harmonic notch filter 72. If randomness is the only arc characteristic desired to be checked, then the output of the harmonic notch filter itself provides arc detection indication. It is preferred that the above noted additional characteristics also be checked before providing an arc indicative trip signal. The synchronous summing and the condition checking are desirable in order to reduce nuisance tripping. Where nuisance tripping is not a problem, or where further cost savings are desired, the output of harmonic notch filter 72 may provide an arc indicative trip signal, relying on the characteristic that an arc is random and does not strike at the same relative phase point in each cycle. In this latter case, the given test conditions may be the existence of the current difference signals themselves. It is the purpose of the additional rules or conditions to establish concentration of random activity into regions within an AC cycle which enables discriminating an arc from normally operating loads.

Section checker 140 checks the signal on line 138 from AND gate 120 over a given number of sections of the AC line current. As above noted, synchronous summer 94 accumulates absolute current difference signals ID over m cycles, e.g. m equals 5, to provide a first section, shown in FIG. 3 as section 1. Synchronous summer 94 repeats the accumulation of the m cycles over a plurality of sections. In the preferred embodiment, approximately one second (actually 55 AC cycles) of the AC line current waveform is divided into eleven sections, each having five cycles. Section checker 140 has a high output on line 142 only if its input 138 from AND gate 120 is high for a given number of sections. In the preferred embodiment, the signal on line 138 must be high for three out of eleven consecutive sections, i.e. the noted five conditions checked by condition checker 116 must be met in at least three of eleven consecutive sections. Thus, the arc indicative trip signal is generated only if the noted conditions are met in a given number of sections during a span of a predetermined number of consecutive sections. A high signal on line 142 enables AND gate 144 which in turn outputs the arc indicative trip signal on line 67 if a voltage condition is met, to be described.

The purpose of section checker 140 is to discriminate against switching events, e.g. a light switch being turned on or off. Eleven consecutive sections is 5 cycles, which is nearly 1 second long. If a light switch is turned on or off, the noted conditions checked by condition checker 116 may be satisfied for one or perhaps at most two sections, but it is highly unlikely that such conditions are satisfied for three out of eleven consecutive sections, because such switching event is typically of shorter duration. Without section checker 140, short duration switching events may otherwise cause a false arc indicative trip signal, which is considered a nuisance trip. The inclusion of section checker 140 reduces such nuisance tripping.

Voltage harmonic notch filter 146, FIG. 3, senses cycle to cycle changes in AC line voltage and generates voltage difference signals representing these changes. The arc indicative trip signal is disarmed when the voltage difference signals exceed a given threshold. Harmonic notch filter 146 performs point for point subtraction of AC line voltages to provide harmonic notch filter voltage difference signals HNFV, the absolute value of which provides voltage difference signals VD at time t according to:

$$VD(t)=|HNFV(t)|=|V(t)-V(t-T)| \quad \text{Eq. 3.}$$

The AC line voltage change is preferably sensed between consecutive cycles, though other or intermittent cycle to cycle changes may be sensed. The voltage is preferably sensed through a voltage divider ohmically connected to line 46, though other voltage sensors may be used, for example as shown at 66 in the incorporated '685 patent.

AC line voltage is sampled at a phase $\Phi_{1,1}$ during a first cycle of the AC source to provide a voltage $V_{1,1}$, where the first subscript is the sampling point or phase, and the second subscript is the cycle. The AC line voltage is sampled at a phase $\Phi_{1,2}$ during a second cycle of the AC source to provide a voltage $V_{1,2}$, where $\Phi_{1,1}$ equals $\Phi_{1,2}$, i.e. the voltage is sampled at the same relative phase or sampling point during first and second cycles. $V_{1,1}$ is subtracted from $V_{1,2}$ to provide the HNFV difference signal, the absolute value of which is the voltage difference signal VD.

The AC line voltage is sampled with harmonic notch filter 146 at a plurality of phases $\Phi_{1,1}$ through $\Phi_{p,1}$ during a first cycle of the AC source to provide a plurality of sampled voltages $V_{1,1}$ through $V_{p,1}$. In the preferred embodiment, p equals n, and hence there are 1,341 voltage sampling points or phases, which span in the preferred embodiment 16.67 milliseconds. The AC line voltage is sampled with harmonic notch filter 146 at a plurality of phases $\Phi_{1,2}$ through $\Phi_{p,2}$ during a second cycle of the AC source to provide a plurality of sampled voltages $V_{1,2}$ through $V_{p,2}$, where $\Phi_{1,1}$ through $\Phi_{p,1}$ equals $\Phi_{1,2}$ through $\Phi_{p,2}$, respectively. $V_{1,1}$ through $V_{p,1}$ is subtracted point for point from $V_{1,2}$ through $V_{p,2}$, respectively, to provide HNFV difference signals, the absolute value of which provides voltage difference signals $VD_1$ through $VD_p$. Summer 148 sums the absolute value of the voltage difference signals VD over the p sampling points or phases to provide a sum. When such sum exceeds a given threshold, as determined by threshold detector 150, then the arc indicative trip signal is disarmed. In the preferred embodiment, the threshold is 3.73 times the number of sampling points or phases p.

For example, AC line voltage is sampled at a first phase $\Phi_{1,1}$ during a first cycle of the AC source to provide a voltage $V_{1,1}$. AC line voltage is sampled at a second phase $\Phi_{2,1}$ during the first cycle of the AC source to provide a voltage $V_{2,1}$. AC line voltage is sampled at a first phase $\Phi_{1,2}$ during a second cycle of the AC source to provide a voltage $V_{1,2}$, wherein $\Phi_{1,1}$ equals $\Phi_{1,2}$. AC line voltage is sampled at a second phase $\Phi_{2,2}$ during the second cycle of the AC source to provide a voltage $V_{2,2}$, where $\Phi_{2,1}$ equals $\Phi_{2,2}$. $V_{1,1}$ is subtracted from $V_{1,2}$ to provide an HNFV signal, the absolute value of which provides a voltage difference signal $VD_{1,2-1}$. $V_{2,1}$ is subtracted from $V_{2,2}$ to provide an HNFV difference signal, the absolute value of which provides a voltage difference signal $VD_{2,2-1}$. Summer 148 sums $VD_{1,2-1}$ and $VD_{2,2-1}$ to provide a sum indicating voltage change from the first cycle to the second cycle. As noted above, preferably p equals n equals 1,341. The number of sampling points or phases p may be varied according to application.

The AC line voltage is sampled at a plurality of phases $\Phi_1$ through $\Phi_p$ during a cycle. Harmonic notch filter 146 provides p cycle to cycle absolute voltage difference signals $VD_1$ through $VD_p$, one for each of the phases $\Phi_1$ through $\Phi_p$. Each voltage difference signal VD represents the absolute value of the difference between the voltage at its respective phase in the present cycle and the voltage at the same respective phase in a previous cycle, preferably the immediately preceding cycle. Summer 148 sums the first through the $p^{th}$ absolute voltage difference signals to provide a summed voltage change activity signal.

When the summed voltage change activity signal from summer 148 exceeds the noted given threshold, then the output of threshold detector 150 on line 152 goes high. The high state on line 152 is inverted low by inverter 154, which provides a low state on line 156 which is input to AND gate 144 to disable the latter, and hence disarm or prevent generation of an arc indicative trip signal on line 67.

The high state on line 152 also provides a reset signal at 158 to section checker 140 to interrupt any ongoing checking process and restart same to begin counting eleven consecutive sections upon receipt of a high state on line 138. A high state on line 138 activates section checker 140 to begin counting eleven consecutive sections. As soon as a high state is present for any two of the next ten sections, then output 142 goes high, and does so without waiting for any remaining sections. For example, if line 138 is high for sections 1, 3 and 8, then output 142 goes high at section 8, without waiting for the remaining sections 9 through 11. The reset signal at 158 interrupts the section checking, regardless of how many sections have been counted, and initiates a 0.1 second delay during which section checker 140 is cleared and then becomes available to begin counting upon the next-received high state on line 138, which high state initiates the eleven section counting process. Such next-received high state occurs in section 1 of the newly started counting process and provides the first of the three required sections in order to generate an arc indicative trip signal.

A high state on line 152 indicates that the voltage change is coming from the supply side of the distribution circuit 20, i.e. the left side of the circuit in FIG. 2, at AC source 26, rather than from the load side, i.e. the right side of the circuit in FIG. 2, at load 30 or 31. If there are cycle to cycle changes in both current and voltage, as sensed by current harmonic notch filter 72 and voltage harmonic notch filter 146, respectively, then the arc indicative trip signal is disabled because the changing supply side voltage may be causing the current changes, or at least it is unknown whether an arc is causing the current changes. In this situation, it is desired that the breaker not be tripped due to events on the supply side, and hence the trip signal on line 67 is disabled when line 152 goes high indicating the noted voltage change.

If there are cycle to cycle current changes as sensed by current harmonic notch filter 72, but not the noted voltage change, then the arc is on the load side. The absence of appropriate voltage change maintains line 152 low, which in turn enables AND gate 144 to generate the arc indicative trip signal on line 67 as controlled by the state of line 142.

An arc is a kind of variable impedance. When the impedance changes, the current changes, but the supply voltage from the AC source 26 provided by the utility company is relatively stiff and does not change. Hence, there is no voltage change sensed by voltage harmonic notch filter 146, and line 152 remains low. The changing current sensed by current harmonic notch filter 72 is caused by some event other than changing supply voltage from source 26. As above noted, it is desired that changing supply voltage from source 26 not be identified as an arc to trip breaker 34.

Figure 12:
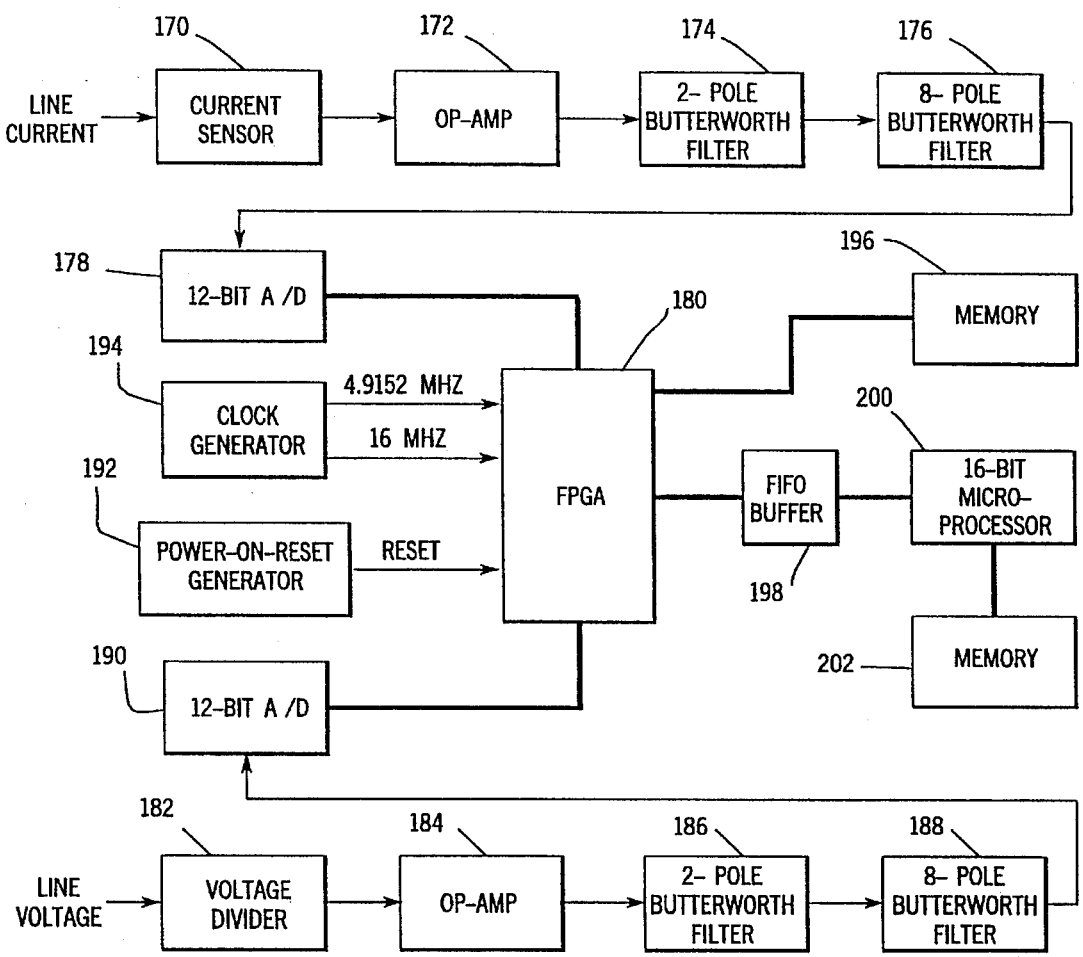
FIG. 12 is a functional circuit block diagram of the arc detector of FIG. 3.

FIG. 12 further shows arc detector 64. AC line current is sensed with current sensor 170 provided by a current transformer, as above noted, terminated with a high impedance load and providing an approximation of the first derivative of current with respect to time which is fed to an operational amplifier 172 with gain and providing integration of the DI/DT signal back to a current signal. The current signal is fed through a 2-pole Butterworth anti-aliasing filter 174 and an 8-pole Butterworth low pass switched capacitor filter 176. The total filter has ten poles which reduces the signal down 60 dB at the Nyquist frequency. The signal is then supplied to a 12-bit A/D converter 178, provided by an Analog Devices, Inc. AD7886, converting the analog input to a digital output which is fed into field programmable gate array, FPGA, 180, provided by an Actel Corp. A1280-1PQ160C.

AC line voltage is sensed with a voltage sensor 182, preferably provided by a voltage divider including passive filtering, and then supplied through op amp 184, 2-pole Butterworth filter 186, 8-pole Butterworth filter 188, and 12-bit A/D converter 190, provided by an Analog Devices, Inc. AD7886, to FPGA 180. FPGA 180 provides the noted 60 Hz harmonic notch filters and the synchronous summer, and is externally controlled by a power-on-reset generator 192 and a clock generator 194 providing 4.9152 MHz and 16 MHz clock signals. Memory 196 is provided by an Integrated Device Technology Corp. IDT71586, including 4K by 16 RAM for the current harmonic notch filter, 4K by 16 RAM for the voltage harmonic notch filter, and 4K by 16 RAM for the synchronous summer. FPGA 180 is linked by a first-in-first-out, FIFO, buffer 198, provided by an Advanced Micro Devices, Inc. AM7204-35, to a 16-bit microprocessor 200, provided by a Motorola MC68HC000, for transferring synchronous summer data therebetween. Microprocessor 200 is provided with a memory 202, provided by an Integrated Device Technology Corp. IDT71586, including 4K by 16 synchronous summer RAM, 4K by 16 data RAM, and 8K by 16 code ROM. Microprocessor 200 and FPGA 180 are operated in accordance with FIG. 3. It is expected that in future development the FPGA and perhaps the microprocessor will be replaced by an ASIC, application specific integrated circuit. Digital signal processing is preferred, though the invention may be implemented in an analog processing system if desired.

Figure 13:
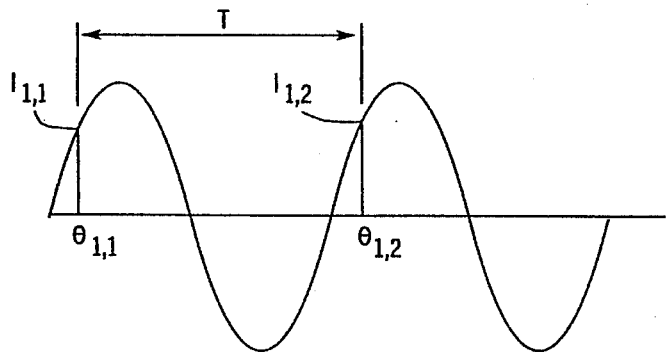
FIGS. 13 and 14 show a reference sine wave with points related in phase labelled.

The above described arc detection method involves sensing cycle to cycle changes in AC line current and generating difference signals representing such changes, and responding to given conditions of such difference signals to generate an arc indicative signal. This is shown in FIG. 13 where current $I_{1,1}$ at the first sampling point or phase in the first cycle, $\Theta_{1,1}$, is subtracted from the current $I_{1,2}$ sensed at the first sampling point or phase in the second cycle, $\Theta_{1,2}$. This provides the noted cycle to cycle sensing of changes in AC line current.

Figure 14:
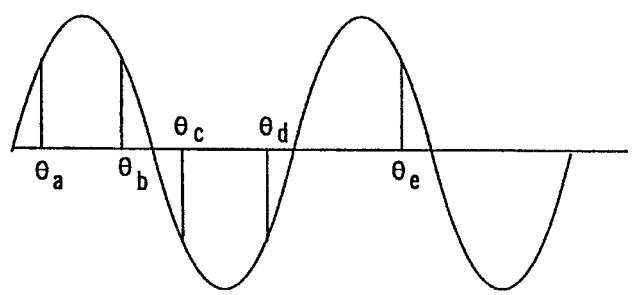

An alternate method involves sensing subcycle changes in AC line current and generating difference signals representing such changes, and responding to given conditions of such difference signals to generate an arc indicative signal, wherein the subcycle is less than the cycle of the AC source. This is illustrated in FIG. 14 where the AC line current is sensed at $\Theta_a$, $\Theta_b$, $\Theta_c$ and $\Theta_d$. First considering the subcycle from FIG. 14, it is seen that the AC line current at point $\Theta_a$ of the AC waveform has the same absolute value as the AC line current at point $\Theta_c$ of the AC waveform, absent a disturbance, such as an arc or a transient. Hence, the absolute value of the current difference signal between the current sensed at $\Theta_c$ and the current sensed at $\Theta_a$ is normally zero in the absence of an arc. Points $\Theta_a$ and $\Theta_c$ have the same relative spacing from a respective zero crossing of the AC waveform. It is likewise noted that the AC line current at point $\Theta_a$, FIG. 14, has the same absolute value as the AC line current at $\Theta_b$, absent a disturbance, such as an arc. Hence, the absolute value of the current difference signal between the AC line current at $\Theta_b$ and $\Theta_a$ is normally zero in the absence of an arc. Points $\Theta_a$ and $\Theta_b$ have the same relative spacing from a respective zero crossing of the AC waveform. The same relationship exists between $\Theta_c$ and $\Theta_d$, between $\Theta_b$ and $\Theta_d$, between $\Theta_b$ and $\Theta_c$, and between $\Theta_a$ and $\Theta_d$. The various time intervals between the various noted points is less than one cycle of the AC source. The time interval between points $\Theta_a$ and $\Theta_c$, and between $\Theta_b$ and $\Theta_d$, is one-half of the cycle of the AC source. The time interval between points $\Theta_a$ and $\Theta_b$, and between $\Theta_b$ and $\Theta_c$, and between $\Theta_c$ and $\Theta_d$, is less than one-half of the cycle of the AC source. The time interval between points $\Theta_a$ and $\Theta_d$ is less than one cycle of the AC source and greater than one-half of the cycle of the AC source. When determining the difference between AC line currents at phases in opposite half-cycles, the algebraic sign of one or the other of the currents is inverted. For example, when determining the difference between the AC line current at point $\Theta_c$ and $\Theta_a$, the negative value of the current at is inverted to a positive value, and the positive valued current at $\Theta_a$ is subtracted from the positive valued current at $\Theta_c$ to provide the noted HNFI difference signal, the absolute value of which provides the noted current difference signal ID. There is no need for such algebraic sign inversion when determining current differences at phase points within the same half-cycle or when the phase points are both in a negative half-cycle or when the phase points are both in a positive half-cycle.

In general, the present method involves sensing changes in AC line current at predetermined points of the AC waveform, e.g. $\Theta_{1,1}$ and $\Theta_{1,2}$ in FIG. 13, $\Theta_a$ and $\Theta_c$ in FIG. 14, $\Theta_a$ and $\Theta_b$ in FIG. 14, etc., and generating difference signals representing such changes, and responding to given conditions of such difference signals to generate an arc indicative signal. The noted points of the AC waveform have the same absolute value absent a disturbance, such as an arc, such that the difference of the absolute values of the current difference signals is normally zero in the absence of an arc. The noted points have the same relative spacing from a respective zero crossing of the AC waveform. In the preferred embodiment, the time interval between the noted sampling points is equal to one cycle of the AC source, i.e. time interval T, FIGS. 3 and 13. In another embodiment, the period between the sampling points is greater than one cycle of the AC source, and an integral multiple thereof. In another embodiment, the period between the sampling points is less than one cycle of the AC source. In another embodiment, the period between the sampling points is one divided by a multiple of the noted AC source frequency, where the multiple is an integer. In another embodiment, it would be possible to compare a point in one cycle with a corresponding point in another cycle not an integral number of cycles away, e.g. points $\Theta_a$ and $\Theta_e$, FIG. 14. The present method includes sensing harmonic changes in AC line current by measuring the AC line current at predetermined periodic points in the AC waveform and generating difference signals representing such changes, and responding to given conditions of such difference signals to generate an arc indicative signal.

There are some events which clearly should lead to an arc indicative trip signal. Examples are contacts which are teased, contaminated, or slowly moving, e.g. defective snap action, bimetallically controlled, etc. The present invention provides an arc indicative trip signal in response to these events.

A class of equipment which can provide current signals having arc-like characteristics are certain SCR (silicon controlled rectifier) controlled commutated loads, for example when operated in the full wave mode at low speed (relative to maximum), i.e. partial duty cycle, and having a commutation mechanism, e.g. brushes. The reason for an arc-like current signature is that the phase controlled duty cycle under full wave conditions insures the existence of two quiet zones, while the commutation provides the cycle to cycle variations required. The solution to nuisance tripping or other false arc indication in such implementation depends on using a feature of SCR controlled loads, namely that they turn off the current at a zero crossing (self commutate) leading to a very low power factor trace at low mechanical speeds. Detecting this, e.g. by relating the synchronous sum features, e.g. peak, to the phase of the voltage, e.g. detected by a zero crossing, can provide a condition that could be used in the condition checker to prevent an arc indicative output trip signal.

A small percentage of constant speed commutated (brush) motors, particularly aged motors, can lead to noisy traces which may provide undesirable arc indication. In such case, it has been found that the total number of transitions of the synchronous summer waveform from below to above the quiet zone threshold is very large compared to the number corresponding to an arc. This characteristic can be used to prevent nuisance tripping, for example by requiring less than a given number of peaks such as 84 and 86, FIG. 11, per cycle, i.e. by requiring that the current difference signals cross a given threshold no more than a given number of times during a given interval.

It is recognized that various equivalents, alternatives and modifications are possible within the scope of the appended claims.

We claim:

1. An arc detection method for an electric circuit supplying AC line current to a load from an AC source providing an AC waveform of given frequency, comprising sensing changes in AC line current at predetermined points of said AC waveform and generating difference signals representing said changes, generating from said difference signals cumulative difference signals having magnitudes at said predetermined points of said AC waveform derived from said difference signals over a preselected number of cycles of said AC waveform, and responding to given conditions of said cumulative difference signals to generate an arc indicative signal.

2. The method according to claim 1 comprising disabling said arc indicative signal in response to a given nuisance condition.

3. The method according to claim 1 wherein one of said given conditions is that the average value of said cumulative difference signals exceeds a given threshold current, and generating said arc indicative signal only if said average value exceeds said given threshold current.

4. The method according to claim 1 wherein one of said conditions is that the peak to average ratio of said cumulative difference signals exceeds a given threshold ratio, where said peak is the maximum value of said cumulative difference signals, and said average is the average value of said cumulative difference signals, and generating said arc indicative signal only if said peak to average ratio exceeds said given threshold ratio.

5. The method according to claim 4 comprising generating said arc indicative signal only if said cumulative difference signals cross a given threshold no more than a given number of times during a given interval.

6. The method according to claim 1 wherein one of said conditions is that there be at least a given number of quiet zones during a given interval of said AC waveform, each quiet zone being of a minimum time length, where a quiet zone is a duration wherein said cumulative difference signals stay below a given current activity threshold, and generating said arc indicative signal only if there are at least said given number of quiet zones per given interval.

7. The method according to claim 6 comprising ignoring any non-quiet zone having a duration less than a given duration, to avoid high frequency anomalies, such that said non-quiet zone must have at least said given duration to interrupt said quiet zone, wherein said non-quiet zone is a duration wherein said cumulative difference signals rise above said given current activity threshold.

8. The method according to claim 1 wherein one of said conditions is that there be no quiet zone longer than a given quiet time upper limit, where a quiet zone is a duration wherein said cumulative difference signals stay below a given current activity threshold, and disabling 1 said arc indicative signal if any quiet zone lasts longer than said given quiet time upper limit.

9. The method according to claim 1 comprising accumulating said cumulative difference signals in a synchronous summer, and wherein one of said conditions is that the output of said synchronous summer be zero for no longer than a given null time upper limit, and disabling said arc indicative signal if any zero output of said synchronous summer lasts longer than said given null time upper limit.

10. The method according to claim 1 comprising accumulating said difference signals in a synchronous summer to generate said cumulative difference signals, and generating said arc indicative signal in response to at least one condition selected from a group consisting of:

the average value of said cumulative difference signals exceeds a given threshold current;

the peak to average ratio of said cumulative difference signals exceeds a given threshold ratio, where said peak is the maximum value of said cumulative difference signals, and said average is the average value of said cumulative difference signals;

there be at least a given number of quiet zones during a given interval of said AC waveform, each quiet zone being of a minimum time length, where a quiet zone is a duration wherein said cumulative difference signals stay below a given current activity threshold;

there be a no quiet zone longer than a given quiet time upper limit; and the output of said synchronous summer be zero for no longer than a given null time upper limit.

11. The method according to claim 1 comprising sensing said AC line current at points of said AC waveform having the same absolute value absent a disturbance, including an arc, such that the difference of said absolute values is normally zero in the absence of an arc.

12. The method according to claim 1 comprising sensing a given AC line voltage parameter, and disarming said arc indicative signal in response to a predetermined condition of said parameter.

13. The method according to claim 12 comprising sensing changes in AC line voltage at predetermined points of said AC waveform, and generating voltage difference signals representing said changes, and disarming said arc indicative signal when said voltage difference signals exceed a given threshold.

14. The method according to claim 1 comprising sensing a given AC line voltage parameter, and disarming said arc indicative signal in response to a given combination of said AC line voltage parameter and said cumulative difference signals representing said changes in sensed AC line current.

15. An arc detection method for an electric circuit supplying AC line current to a load from an AC source of given frequency providing repetitive cycles, comprising sensing cycle to cycle changes in said AC line current and generating difference signals representing said changes, generating from said difference signals cumulative difference signals having magnitudes cycle-to-cycle derived from said difference signals over a preselected number of cycles of said AC line current, and responding to given conditions of said cumulative difference signals to generate an arc indicative signal.

16. The method according to claim 15 comprising sampling AC line current at a phase $\Theta_{1,1}$ during a first cycle of said AC source to provide a first current $I_{1,1}$, sampling AC line current at a phase $\Theta_{1,2}$ during a second cycle of said AC source to provide a second current $I_{1,2}$, where $\Theta_{1,1}$ equals $\Theta_{1,2}$, and subtracting $I_{1,1}$ from $I_{1,2}$ to provide said difference signal.

17. The method according to claim 15 comprising sensing said cycle to cycle AC line current changes and generating said difference signals with a harmonic notch filter.

18. The method according to claim 17 comprising sampling AC line current with said harmonic notch filter at a plurality of phases $\Theta_{1,1}$ through $\Theta_{n,1}$ during a first cycle of said AC source to provide a plurality of sampled currents $I_{1,1}$ through $I_{n,1}$, sampling AC line current with said harmonic notch filter at a plurality of phases $\Theta_{1,2}$ through $\Theta_{n,2}$ during a second cycle of said AC source to provide a plurality of sampled currents $I_{1,2}$ through $I_{n,2}$, wherein $\Theta_{1,1}$ through $\Theta_{n,1}$ equals $\Theta_{1,2}$ through $\Theta_{n,2}$, respectively, and subtracting point for point $I_{1,1}$ through $I_{n,1}$ from $I_{1,2}$ through $I_{n,2}$, respectively.

19. The method according to claim 18 wherein said first and second cycles are consecutive.

20. The method according to claim 15 wherein said difference signals are the absolute values of said cycle to cycle changes in AC line current.

21. The method according to claim 15 comprising disabling said arc indicative signal in response to a given nuisance condition.

22. The method according to claim 15 wherein one of said conditions is that the average value of said cumulative difference signals exceeds a given threshold current, and generating said arc indicative signal only if said average value exceeds said given threshold current.

23. The invention according to claim 15 wherein one of said conditions is that the peak to average ratio of said cumulative difference signals exceeds a given threshold ratio, where said peak is the maximum value of said cumulative difference signals, and said average is the average value of said cumulative difference signals, and generating said arc indicative signal only if said peak to average ratio exceeds said given threshold ratio.

24. The method according to claim 23 comprising generating said arc indicative signal only if said cumulative difference signals cross a given threshold no more than a given number of times during a given interval.

25. The method according to claim 15 wherein one of said conditions is that there be at least two quiet zones per cycle, each quiet zone being of a minimum time length, where a quiet zone is a portion of a cycle wherein said cumulative difference signals stay below a given current activity threshold, and generating said arc indicative signal only if there are at least two quiet zones per cycle.

26. The method according to claim 25 comprising ignoring any non-quiet zone having a duration less than a given duration, to avoid high frequency anomalies, such that said non-quiet zone must have at least said given duration to interrupt said quiet zone, wherein said non-quiet zone is a duration wherein said cumulative difference signals rise above said given current activity threshold.

27. The method according to claim 15 wherein one of said conditions is that there be no quiet zone longer than a given quiet time upper limit, where a quiet zone is a portion of a cycle wherein said cumulative difference signals stay below a given current activity threshold, and disabling said arc indicative signal if any quiet zone lasts longer than said given quiet time upper limit.

28. The method according to claim 15 comprising accumulating said difference signals in a synchronous to generate said cumulative difference signals summer and wherein one of said conditions is that the output of said synchronous summer be zero for no longer than a given null time upper limit, and disabling said arc indicative signal if any zero output of said synchronous summer lasts longer than said given null time upper limit.

29. The method according to claim 15 comprising accumulating said difference signals in a synchronous summer to generate said cumulative difference signals, and generating said arc indicative signal in response to at least one condition selected from a group consisting of:

the average value of said cumulative difference signals exceeds a given threshold current;

the peak to average ratio of said cumulative difference signals exceeds a given threshold ratio, where said peak is the maximum value of said cumulative difference signals, and said average is the average value of said cumulative difference signals;

there be at least two quiet zones per cycle, each quiet zone being of a minimum time length, where a quiet zone is a portion of a cycle wherein said cumulative difference signals stay below a given current activity threshold;

there be no quiet zone longer than a given quiet time upper limit; and the output of said synchronous summer be zero for no longer than a given null time upper limit.

30. The method according to claim 15 comprising accumulating said difference signals in a synchronous summer over m cycles to provide a first section, and repeating said accumulation of said m cycles over a plurality of sections, and generating said arc indicative signal only if said conditions are met in a given number of sections during a span of a predetermined number of consecutive sections.

31. An arc detection method for an electric circuit supplying AC line current to a load from an AC source of given frequency providing repetitive cycles, comprising sensing cycle to cycle changes in said AC line current and generating difference signals representing said changes, responding to given conditions of said difference signals to generate an arc indicative signal, and sensing a given AC line voltage parameter, and disarming said arc indicative signal in response to a predetermined condition of said parameter.

32. The invention according to claim 31 comprising disarming said arc indicative signal in response to a given combination of said predetermined condition of said given AC line voltage parameter and said difference signals representing said changes in sensed AC line current.

33. The method according to claim 31 comprising sensing cycle to cycle changes in AC line voltage and generating voltage difference signals representing said changes, and disarming said arc indicative signal when said voltage difference signals exceed a given threshold.

34. The method according to claim 33 comprising sensing AC line voltage changes between consecutive cycles.

35. The method according to claim 33 comprising sampling AC line voltage at a phase $\Phi_{1,1}$ during a first cycle of said AC source to provide a first voltage $V_{1,1}$, sampling AC line voltage at a phase $\Phi_{1,2}$ during a second cycle of said AC source to provide a second voltage $V_{1,2}$, where $\Phi_{1,1}$ equals $\Phi_{1,2}$, and subtracting $V_{1,1}$ from $V_{1,2}$ to provide said voltage difference signal.

36. The method according to claim 33 comprising sensing said cycle to cycle AC line voltage changes and generating said voltage difference signals with a harmonic notch filter.

37. The method according to claim 36 comprising sampling AC line voltage with said harmonic notch filter at a plurality of phases $\Phi_{1,1}$ through $\Phi_{p,1}$ during a first cycle of said AC source to provide a plurality of sampled voltages $V_{1,1}$ through $V_{p,1}$, sampling AC line voltage with said harmonic notch filter at a plurality of phases $\Phi_{1,2}$ through $\Phi_{p,2}$ during a second cycle of said AC source to provide a plurality of sampled voltages $V_{1,2}$ through $V_{p,2}$, where $\Phi_{1,1}$ through $\Phi_{p,1}$ equals $\Phi_{1,2}$ through $\Phi_{p,2}$, respectively, and subtracting point for point $V_{1,1}$ through $V_{p,1}$ from $V_{1,2}$ through $V_{p,2}$, respectively.

38. The method according to claim 37 comprising summing said voltage difference signals over a given number of points to provide a sum, and disarming said arc indicative signal when said sum exceeds a given threshold.

39. An arc detection method for an electric circuit supplying AC line current to a load from an AC source of given frequency providing repetitive cycles, comprising:

sampling AC line current at a phase $\Theta_{1,1}$ during a first cycle of said AC source to provide a current $I_{1,1}$;

sampling AC line current at a phase $\Theta_{1,2}$ during a second cycle of said AC source to provide a current $I_{1,2}$, where $\Theta_{1,1}$ equals $\Theta_{1,2}$;

subtracting $I_{1,1}$ from $I_{1,2}$ to provide a current difference signal $ID_{1,2-1}$;

sampling AC line current at a phase $\Theta_{1,3}$ during a third cycle of said AC source to provide a current $I_{1,3}$, where $\Theta_{1,2}$ equals $\Theta_{1,3}$;

subtracting $I_{1,2}$ from $I_{1,3}$ to provide a current difference signal $ID_{1,3-2}$;

summing $ID_{1,2-1}$ and $ID_{1,3-2}$ to provide a cumulative current difference signal thereof;

responding to given conditions of said cumulative current difference signal to generate an arc indicative signal.

40. The method according to claim 39 comprising sampling AC line current at a plurality of phases $\Theta_1$ through $\Theta_n$ during each of a plurality of m cycles.

41. The method according to claim 40 comprising providing n cycle to cycle current difference signals, one for each of said phases $\Theta_1$ through $\Theta_n$, summing m of said current difference signals at phase $\Theta_1$ for cycles 1 through m to provide a first cumulative current difference signal, summing m of said current difference signals at phase $\Theta_2$ for cycles 1 through m to provide a second cumulative current difference signal, and continuing said summing through the $n^{th}$ phase including summing m of said current difference signals at phase $\Theta_n$ for cycles 1 through m to provide an $n^{th}$ cumulative current difference signal, and responding to given conditions of said first through $n^{th}$ cumulative current difference signals to generate said arc indicative signal.

42. The method according to claim 41 wherein said first through $m^{th}$ cycles, including said first, second, and third cycles, are consecutive.

43. The method according to claim 39 wherein said current difference signals are the absolute values of said changes in AC line current.

44. The method according to claim 39 comprising sensing a given AC line voltage parameter, and disarming said arc indicative signal in response to a given condition of said parameter.

45. The method according to claim 39 comprising sensing a given AC line voltage parameter, and disarming said arc indicative signal in response to a given combination of said AC line voltage parameter and said cumulative current difference signal representing said changes in sensed AC line current.

46. The method according to claim 39 comprising:

sampling AC line voltage at a first phase $\Phi_{1,1}$ during a first cycle of said AC source to provide a voltage $V_{1,1}$;

sampling AC line voltage a second phase $\Phi_{2,1}$ during said first cycle of said AC source to provide a voltage $V_{2,1}$;

sampling AC line voltage at a first phase $\Phi_{1,2}$ during a second cycle of said AC source to provide a voltage $V_{1,2}$, wherein $\Phi_{1,1}$ equals $\Phi_{1,2}$;

sampling AC line voltage at a second phase $\Phi_{2,2}$ during said second cycle of said AC source to provide a voltage $V_{2,2}$ where $\Phi_{2,1}$ equals $\Phi_{2,2}$;

subtracting $V_{1,1}$ from $V_{1,2}$ to provide a voltage difference signal $VD_{1,2-1}$;

subtracting $V_{2,1}$ from $V_{2,2}$ to provide a voltage difference signal $VD_{2,2-1}$;

summing $VD_{1,2-1}$ and $VD_{2,2-1}$ to provide a sum indicating voltage change from said first cycle to said second cycle at at least two phases in a cycle;

disarming said arc indicative signal when said voltage change sum exceeds a given threshold.

47. The method according to claim 46 comprising:

sampling said AC line voltage at a plurality of phases $\Phi_1$ through $\Phi_p$ during a cycle;

providing p cycle to cycle voltage difference signals, one for each of said phases $\Phi_1$ through $\Phi_p$, each voltage difference signal representing the voltage at its respective phase in the present cycle minus the voltage at the same respective phase in a previous cycle;

summing the first through $p^{th}$ voltage difference signal to provide a summed voltage change activity signal;

disarming said arc indicative signal when said summed voltage change activity signal exceeds said given threshold.

48. The method according to claim 46 wherein said voltage difference signals are the absolute values of said changes in AC line voltage.

\* \* \* \* \*